United States Patent
Yoshikawa et al.

(10) Patent No.: US 7,977,757 B2
(45) Date of Patent: Jul. 12, 2011

(54) MEMS ELEMENT, MEMS DEVICE AND MEMS ELEMENT MANUFACTURING METHOD

(75) Inventors: Yasuhiro Yoshikawa, Kyoto (JP); Hiroyuki Tajiri, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 79 days.

(21) Appl. No.: 11/919,877

(22) PCT Filed: May 19, 2006

(86) PCT No.: PCT/JP2006/310053
§ 371 (c)(1),
(2), (4) Date: Nov. 1, 2007

(87) PCT Pub. No.: WO2006/123788
PCT Pub. Date: Nov. 23, 2006

(65) Prior Publication Data
US 2009/0090987 A1 Apr. 9, 2009

(30) Foreign Application Priority Data

May 19, 2005 (JP) .................................. 2005-146842
May 19, 2005 (JP) .................................. 2005-146843

(51) Int. Cl.
*H01L 29/84* (2006.01)
*H01L 21/00* (2006.01)
*G01L 9/00* (2006.01)
(52) U.S. Cl. ................ 257/419; 257/415; 257/E31.001; 257/E21.001; 438/50; 438/51; 438/52; 438/53
(58) Field of Classification Search .................. 257/415, 257/E31.001, E21.001; 438/50–53
See application file for complete search history.

(56) References Cited

U.S. PATENT DOCUMENTS

| | | | | |
|---|---|---|---|---|
| 5,619,061 | A | * | 4/1997 | Goldsmith et al. ............ 257/528 |
| 6,028,332 | A | * | 2/2000 | Kano et al. ..................... 257/254 |
| 6,060,756 | A | * | 5/2000 | Machida et al. ............... 257/415 |
| 6,105,427 | A | * | 8/2000 | Stewart et al. ............. 73/514.32 |
| 6,435,028 | B1 | | 8/2002 | Nagahara |
| 6,483,395 | B2 | | 11/2002 | Kasai et al. |
| 6,525,396 | B2 | * | 2/2003 | Melendez et al. ............ 257/528 |
| 6,635,919 | B1 | * | 10/2003 | Melendez et al. ............ 257/312 |
| 2002/0030729 | A1 | * | 3/2002 | Sako et al. ..................... 347/206 |

(Continued)

FOREIGN PATENT DOCUMENTS

| | | |
|---|---|---|
| JP | 10-284771 | 10/1998 |
| JP | 2001-235485 | 8/2001 |
| JP | 2001-266727 | 9/2001 |

(Continued)

OTHER PUBLICATIONS

International Search Report from corresponding PCT/JP2006/310053, mailed Jul. 18, 2006.

*Primary Examiner* — Zandra Smith
*Assistant Examiner* — Jeremy J Joy
(74) *Attorney, Agent, or Firm* — Hamre, Schumann, Mueller & Larson, P.C.

(57) ABSTRACT

An MEMS element (A1) includes a substrate (1), and a first electrode (2) formed on the substrate (1). The MEMS element (A1) further includes a second electrode (3) including a movable portion (31) spaced from the first electrode (2) and facing the first electrode. The movable portion (31) is formed with a plurality of through-holes (31a). Each of the through-holes (31a) may have a rectangular cross section.

20 Claims, 12 Drawing Sheets

U.S. PATENT DOCUMENTS

| | | | |
|---|---|---|---|
| 2003/0022423 A1* | 1/2003 | Staker et al. | 438/184 |
| 2003/0022424 A1* | 1/2003 | Staker et al. | 438/184 |
| 2006/0171097 A1* | 8/2006 | Shimanouchi et al. | 361/277 |
| 2006/0226735 A1* | 10/2006 | Ikehashi | 310/311 |
| 2007/0039147 A1* | 2/2007 | Shimanouchi et al. | 29/25.03 |

FOREIGN PATENT DOCUMENTS

| | | |
|---|---|---|
| JP | 2004-12327 | 1/2004 |
| JP | 2004-85870 | 3/2004 |
| JP | 2005-40885 | 2/2005 |

* cited by examiner

MEMS ELEMENT, MEMS DEVICE AND MEMS ELEMENT MANUFACTURING METHOD

TECHNICAL FIELD

The present invention relates to an MEMS (Micro Electro Mechanical System) element and a manufacturing method thereof. The present invention also relates to an MEMS device using such an MEMS element.

BACKGROUND ART

Conventional MEMS elements are disclosed in e.g. Patent Documents 1 and 2 listed below. The MEMS element disclosed in Patent Document 1 will be described below with reference to FIGS. 18 and 19 of the present application, and the MEMS element disclosed in Patent Document 2 will be described below with reference to FIGS. 20 and 21.

Patent Document 1: JP-A-2004-12327
Patent Document 2: JP-A-2005-40885

The conventional MEMS device X shown in FIG. 18, structured as a capacitance type acceleration sensor, includes a substrate 91 on which an MEMS element Y and controllers 95a and 95b are mounted. The substrate 91, the MEMS element Y and the controllers 95a and 95b are covered by a resin package 96. A plurality of external terminals 97 for mounting project from the resin package 96.

FIG. 19 is an exploded perspective view of the MEMS element Y. As shown in the figure, the MEMS element Y includes a pair of glass substrates 92a and 92c, and an Si substrate 92b which are laminated. A movable electrode 94 comprising a movable portion 94a and a support portion 94b is incorporated in the Si substrate 92b. The MEMS element Y including such an Si substrate is generally called an MEMS element by bulk micromachining.

The paired glass plates 92a and 92c are formed with fixed electrodes 93a and 93b, respectively. The movable portion 94a and the fixed electrode 93a face each other, thereby forming a variable capacitor. Similarly, another capacitor is formed between the movable portion 94a and the fixed electrode 93b. When acceleration occurs in the vertical direction in FIG. 19, the movable electrode 94 is relatively moved up or down, whereby the capacitances of the two capacitors will vary. Based on the variation of the capacitances, the MEMS device X determines the magnitude of the acceleration.

The MEMS device X may be mounted to a cellular phone provided with a HDD as the recording medium. With such an arrangement, when the cellular phone is overaccelerated, the MEMS device X detects the acceleration. For instance, when the user drops the cellular phone onto the floor, the MEMS device X can detect the fall. Thus, it is possible to arrange that, based on such detection, the rotation of the HDD may be stopped, or the data read/write head may be moved away from the HDD.

To utilize the MEMS device X in the above-described manner, the MEMS device X needs to have a small thickness to be able to be mounted to the cellular phone. However, the MEMS device X is relatively thick because of the employment of the MEMS element Y processed by the bulk micromachining. Specifically, the Si substrate 92b of the MEMS element Y incorporates the movable electrode 94 by chipping a relatively thick Si material. Thus, the MEMS element Y comprising the lamination of the Si substrate 92b and the glass substrates 92a, 92c has a relatively large thickness. Since the MEMS device X further includes a resin package 96 for sealing the MEMS element, the thickness of the MEMS device X further increases. Thus, the MEMS device X cannot meet the demand for thickness reduction.

As shown in FIG. 20, the MEMS element disclosed in Patent Document 2 includes a substrate 91', and a lower electrode 92' and a wiring 95' formed on the substrate. An upper electrode 93' is connected to the wiring 95'. The upper electrode 93' includes a movable portion 93a' spaced from the lower electrode 92' in the vertical direction in the figure and facing the lower electrode.

When the MEMS element is used for an acceleration sensor, the magnitude of the acceleration in the vertical direction in FIG. 20 is measured based on the variation of the capacitance between the lower electrode 92' and the upper electrode 93'. Specifically, the capacitance between the lower electrode 92' and the upper electrode 93' depends on the size of the gap between the lower electrode 92' and the movable portion 93a' of the upper electrode 93'. When acceleration in the vertical direction is produced, the movable portion 93a' is relatively moved in accordance with the acceleration, causing the size of the gap to vary. As a result, the capacitance varies. By electrically measuring the variation of the capacitance, the magnitude of the acceleration can be determined.

FIG. 21 shows a step in the process of manufacturing the MEMS element of FIG. 20. In this manufacturing process, a sacrifice layer 94' is formed to cover the lower electrode 92', and a movable portion 93a' is formed on the sacrifice layer 94'. Then, by removing the sacrifice layer 94', a gap of a predetermined dimension is defined between the lower electrode 92' and the movable portion 93a'. The removal of the sacrifice layer 94' may be performed by wet etching using an etchant which dissolves only the sacrifice layer 94'.

To enhance the measurement accuracy of the acceleration sensor utilizing an MEMS element, it is preferable that the capacitance of the MEMS element is large. To increase the capacitance of an MEMS element, the size of the lower electrode 92' and movable portion 93a' needs to be increased, and the gap between the lower electrode 92' and the movable portion 93a' needs to be reduced. However, to increase the size of the lower electrode 92' and movable portion 93a', the size of the sacrifice layer 94' also needs to be increased. As a result, the time required for removing the sacrifice layer 94' increases, which deteriorates the manufacturing efficiency of the MEMS element. Further, when the gap between the lower electrode 92' and the movable portion 93a' is reduced, the possibility that the movable portion 93a' adheres to the lower electrode 92' due to the surface tension of the etchant increases. In this way, when the measurement accuracy of an acceleration sensor is intended to be enhanced, various problems are caused in the process of manufacturing the MEMS element.

The above-described problems occur also in the process of manufacturing an actuator using the MEMS element shown in FIG. 20. Specifically, in an actuator utilizing the MEMS element, the movable portion 93a' is driven by applying a voltage between the lower electrode 92' and the upper electrode 93'. To enhance the operation accuracy of the movable portion 93a', the size of the lower electrode 92' and movable portion 93a' needs to be increased, and the gap between the lower electrode 92' and the movable portion 93a' needs to be reduced. However, when the size of the lower electrode 92' and movable portion 93a' is increased, the manufacturing efficiency of the MEMS element is deteriorated. Further, when the gap between the lower electrode 92' and the movable portion 93a' is reduced, these parts may adhere to each other.

DISCLOSURE OF THE INVENTION

The present invention is proposed under the circumstances described above. It is, therefore, an object of the present invention is to provide a technique for achieving the thickness reduction of an MEMS device. Another object of the present invention is to provide an MEMS element which is capable of enhancing the measurement accuracy of an acceleration sensor and the operation accuracy of an actuator.

According to a first aspect of the present invention, there is provided an MEMS element comprising a substrate, a first electrode formed on the substrate, and a second electrode including a movable portion which is spaced from the first electrode and faces the first electrode. The movable portion is formed with a plurality of through-holes.

Preferably, each of the through-holes has an opening width which is five to ten times the distance between the first electrode and the movable portion of the second electrode.

Preferably, the through-holes have a same size and arranged at a constant density.

Preferably, the through-holes are arranged in a matrix.

Preferably, the through-holes are arranged at a pitch which is 15 to 25 times the distance between the first electrode and the movable portion of the second electrode.

According to a second aspect of the present invention, there is provided a method for manufacturing an MEMS element. The method comprises the steps of forming a first electrode on a substrate, forming a sacrifice layer to cover the first electrode, forming a conductor layer on the sacrifice layer, patterning the conductor layer to form a second electrode, and removing the sacrifice layer at a portion sandwiched between the first electrode and the second electrode. The patterning step includes forming a plurality of through-holes in the conductor layer at a portion facing the first electrode via the sacrifice layer. The step of removing the sacrifice layer is performed by dry etching.

Preferably, in the patterning process, each of the through-holes is formed to have an opening width which is five to ten times the thickness of the sacrifice layer.

Preferably, in the patterning process, a pitch between adjacent ones of the through-holes is set to 15 to 25 times the thickness of the sacrifice layer.

According to a third aspect of the present invention, there is provided an MEMS device comprising a substrate, an MEMS element formed on the substrate and including a first electrode and a second electrode, the second electrode including a movable portion which is spaced from the first electrode and faces the first electrode, a resin package including a space for accommodating the MEMS element, and an external terminal for mounting. Each of the first electrode and the second electrode comprises a thin conductor film.

Preferably, the substrate is made of a ceramic material.

Preferably, the movable portion is formed with a plurality of through-holes.

Preferably, each of the through-holes has an opening width which is five to ten times the distance between the first electrode and the movable portion of the second electrode.

Preferably, the through-holes have a same size and arranged at a constant density.

Preferably, the through-holes are arranged in a matrix.

Preferably, the through-holes are arranged at a pitch which is 15 to 25 times the distance between the first electrode and the movable portion of the second electrode.

Preferably, the MEMS device of the present invention further comprises a protective plate facing the substrate across the space.

Preferably, the protective plate is made of Si and includes a surface in which an IC is incorporated.

Other features and advantages of the present invention will become more apparent from detailed description given below with reference to the accompanying drawings.

BEST MODE FOR CARRYING OUT THE INVENTION

Preferred embodiments of the present invention will be described below with reference to the accompanying drawings.

Figure 1:
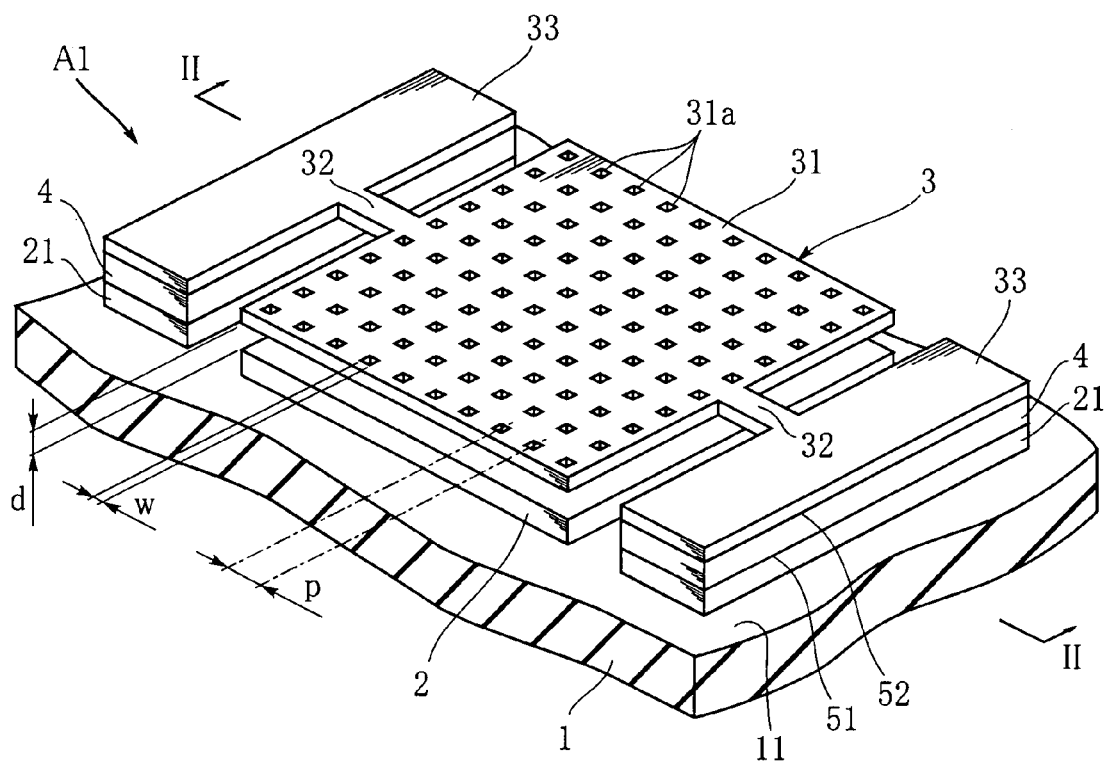
FIG. 1 is a perspective view showing an MEMS element according to a first embodiment of the present invention.
Figure 2:
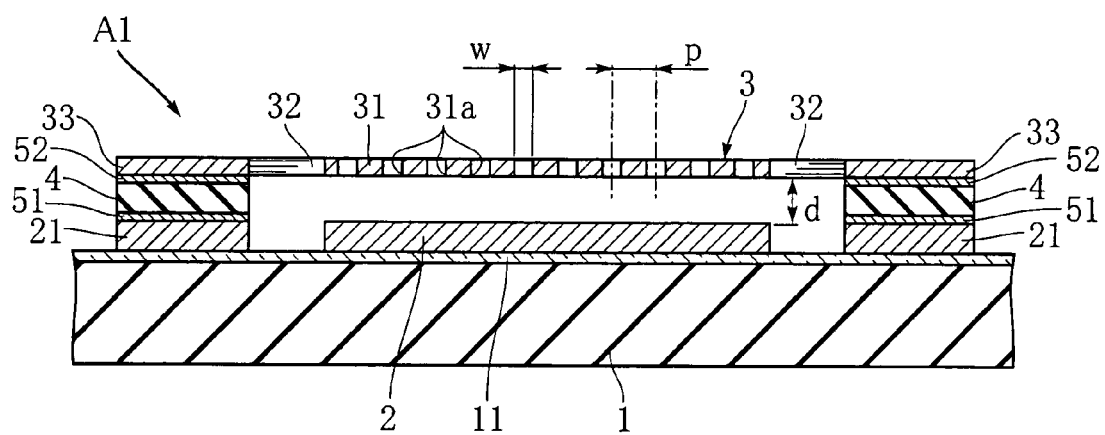
FIG. 2 is a sectional view taken along lines II-II in FIG. 1.

FIGS. 1 and 2 show an MEMS element A1 according to a first embodiment of the present invention. As shown in FIG. 1, the MEMS element A1 includes a substrate 1, and a lower electrode (first electrode) 2, an upper electrode (second electrode) 3, insulating layers 4 and support layers 21 which are formed on the substrate 1. Thus, the MEMS element A1 is structured as a surface-type MEMS element and may be used for an acceleration sensor for detecting the acceleration in the vertical direction in the figures.

The substrate 1 supports the lower electrode 2 and the upper electrode 3 and is made of an insulating material such as $Al_2O_3$. In this embodiment, the substrate 1 has a thickness of about 1 mm. The upper surface of the substrate 1 is covered by a glaze layer 11. The glaze layer 11 provides a smooth surface suitable for forming the lower electrode 2 and so on and may be formed by printing a liquid containing a glass component and then performing baking.

The lower electrode 2 is formed on the glaze layer 11 and generally in the form of a rectangle having a side of about 2 mm. The lower electrode 2 may be made of e.g. Al and have a thickness of about 1.2 μm. A wiring (not shown) is connected to the lower electrode 2.

The support layers 21 are provided on opposite sides of the lower electrode 2. The support layers 21 are utilized for fixing the upper electrode 3 to the substrate 1. Similarly to the lower electrode 2, the support layers 2 may be made of Al and have a thickness of about 1.2 μm.

The insulating layers 4 are laminated on the support layers 21 via a pair of barrier metal layers 51. The insulating layers 4 may be made of Si and have a thickness of about 2.0 μm. The barrier metal layers 51 prevent the support layers 21 and the insulating layers 4 from unduly reacting with each other. The barrier metal layers 51 may be made of TiN and have a thickness of about 250 Å.

The upper electrode 3 is provided on the insulating layers 4 via a pair of barrier metal layers 52. The barrier metal layers 52 prevent the insulating layers 4 and the upper electrode 3 from unduly reacting with each other. The barrier metal layers 52 may be made of TiN and have a thickness of about 250 Å.

The upper electrode 3 includes a drive portion 31, a pair of support portions 32 and a pair of anchor portions 33. The upper electrode 3 may be made of Al and have a thickness of about 0.6 μm.

The movable portion 31 faces the lower electrode 2 while being spaced from the lower electrode by a distance d. With this arrangement, a capacitor having a variable capacitance is formed between the movable portion 31 and the lower electrode 2. In this embodiment, the distance d is about 2.0 μm, which is substantially equal to the thickness of the insulating layers 4. Similarly to the lower electrode 2, the movable portion 31 is generally in the form of a rectangle having a side of about 2 mm.

The movable portion 31 is formed with a plurality of through-holes 31a arranged in a matrix. Each of the through-holes 31a is square in cross section, and the length w of each side of the square (opening width) is about 15 μm. Preferably, the length w is five to ten times the distance d. The pitch p of the through-holes 31a is about 40 μm. Preferably, the pitch p is 15 to 25 times the distance d. The movable portion 31 is supported at two opposite positions, that is, connected to the paired anchor portions 33 via the paired support portions 32.

Each of the support portions 32 is narrower than the movable portion 31 and can be elastically deformed easily. When acceleration in the vertical direction in FIG. 1 is produced, an inertial force proportionate to the mass of the movable portion 31 is applied to the support portions 32. Due to the inertial force, the support portions 32 are flexed, which allows the movable portion 31 to move vertically.

The paired anchor portions 33 are utilized for fixing the upper electrode 3 to the substrate 1 and bonded to the insulating layers 4 via the barrier metal layers 52. The anchor portions 33 are connected to a wiring (not shown) via a wire, for example. The capacitance of the MEMS element A1 can be measured using the wiring (not shown) to which the lower electrode 2 is connected and the wiring (not shown) to which the anchor portions 33 are connected.

A method for manufacturing the MEMS element A1 will be described below with reference to the accompanying drawings.

Figure 3:
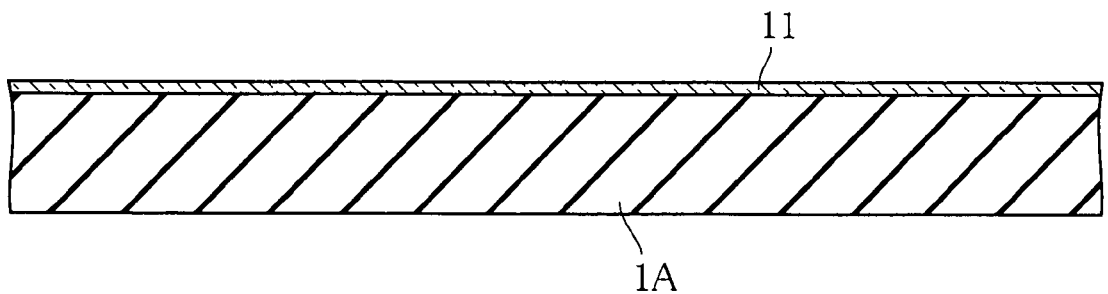
FIG. 3 is a sectional view showing the step of forming a glaze layer on a substrate in a method for manufacturing the MEMS element shown in FIG. 1.

First, as shown in FIG. 3, a material substrate 1A made of $Al_2O_3$ is prepared. In this manufacturing method, use is made of a material substrate 1A of a size capable of producing a plurality of MEMS elements A1. Then, a glaze layer 11 is formed on the material substrate 1A by printing a liquid containing a glass component and then performing baking.

Figure 4:
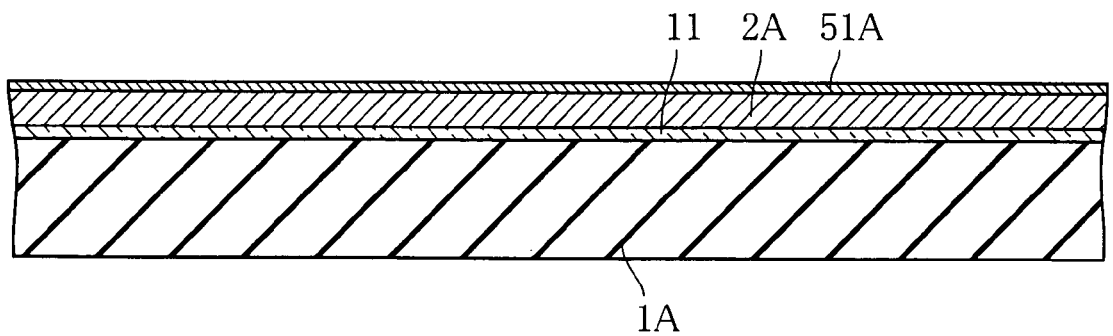
FIG. 4 is a sectional view showing the step of forming a first conductor layer in the manufacturing method.

Then, as shown in FIG. 4, a first conductor layer 2A is formed on the glaze layer 11. Specifically, the first conductor layer 2A is formed by e.g. sputtering using Al. The first conductor layer 2A is formed to have a thickness of about 1.2 μm. Then, a TiN layer 51A is formed on the first conductor layer 2A. Specifically, the TiN layer 51A is formed by e.g. sputtering to have a thickness of about 250 Å.

Figure 5:
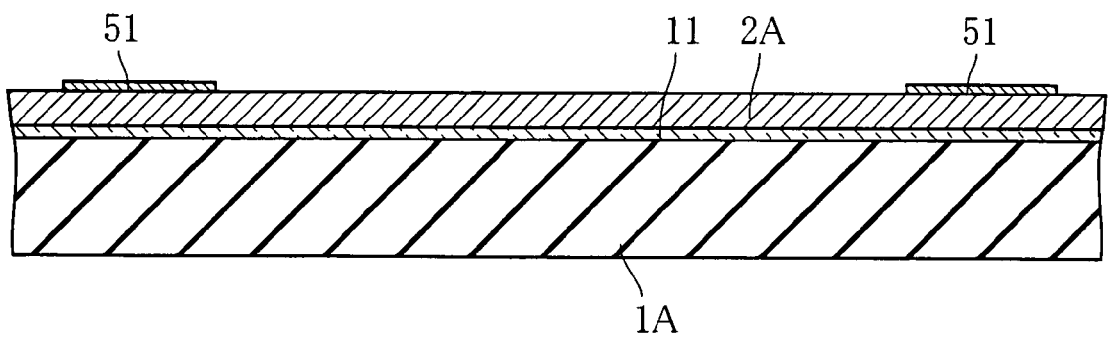
FIG. 5 is a sectional view showing the step of forming a barrier metal layer in the manufacturing method.

After the TiN layer 51A is formed, a pair of barrier metal layers 51 shown in FIG. 5 is formed by patterning the TiN layer 51A. The patterning of the TiN layer 51A may be performed by masking by photolithography and the subsequent dry etching using a gas containing $CF_4$ as the etching gas.

Figure 6:
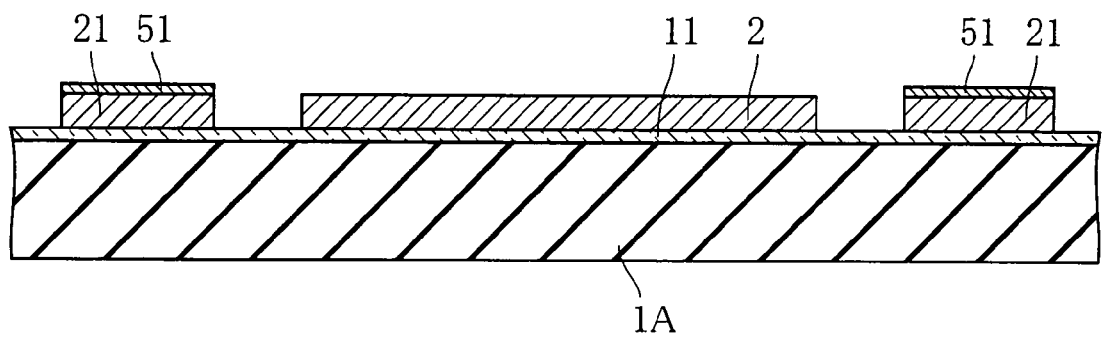
FIG. 6 is a sectional view showing the step of forming a lower electrode in the manufacturing method.

Then, as shown in FIG. 6, a lower electrode 2 and a pair of support layers 21 are formed by patterning the first conductor layer 2A. The patterning may be performed by wet etching using an etchant which dissolves only Al.

Figure 7:
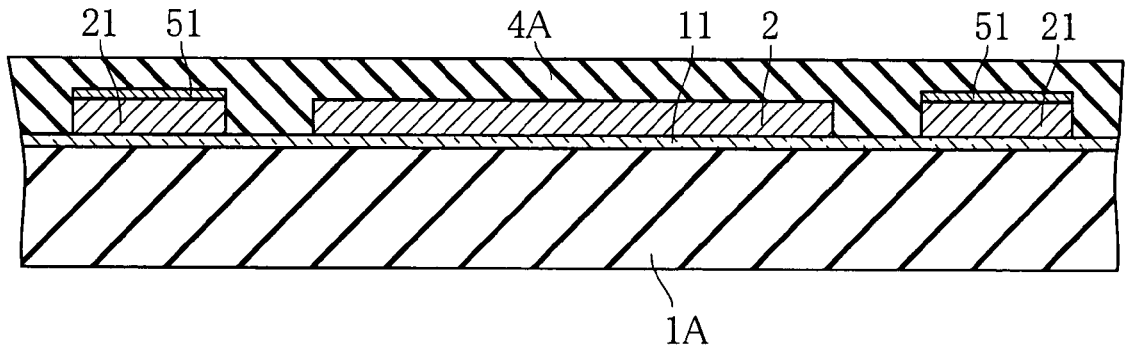
FIG. 7 is a sectional view showing the step of forming a sacrifice layer in the manufacturing method.

As shown in FIG. 7, after the lower electrode 2 and the support layers 21 are formed, a sacrifice layer 4A is formed to cover the lower electrode 2, the paired support layers 21 and the paired barrier metal layers 51. Specifically, the sacrifice layer 4A is formed by e.g. sputtering using Si so that the portion of the sacrifice layer 4A which covers the lower electrode 2 has a thickness of about 2.0 μm.

Figure 8:
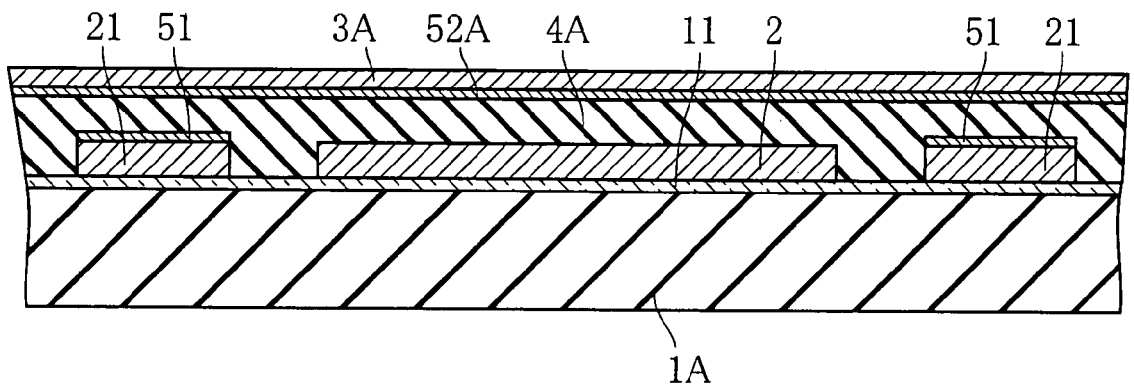
FIG. 8 is a sectional view showing the step of forming a second conductor layer in the manufacturing method.

Then, as shown in FIG. 8, a TiN layer 52A is formed by e.g. sputtering using TiN. The TiN layer 52A is formed to have a thickness of about 250 Å. Then, a second conductor layer 3A is formed on the TiN layer 52A. The second conductor layer 3A is formed by e.g. sputtering using Al. The second conductor layer 3A is formed to have a thickness of about 1.2 μm.

Figure 9:
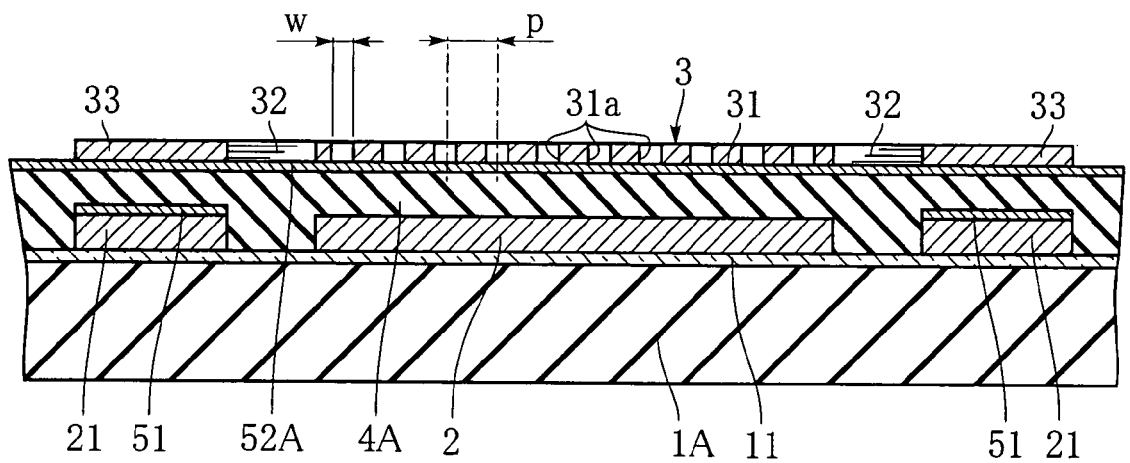
FIG. 9 is a sectional view showing the step of forming an upper electrode in the manufacturing method.

Then, patterning of the second conductor layer 3A is performed. The patterning may be performed by masking by photolithography and the subsequent wet etching using an etchant which dissolves only Al. By this patterning, an upper electrode 3 shown in FIG. 9 is obtained. The patterning is so performed that the movable portion 31 has a size of about 2 mm square. A plurality of through-holes 31a are also formed in the patterning process. Specifically, the through-holes 31a are so formed that each of the through-holes is square in cross section and the length w of each side of the square is about 15 μm. The pitch P between adjacent through-holes 31a is set to about 40 μm.

Figure 10:
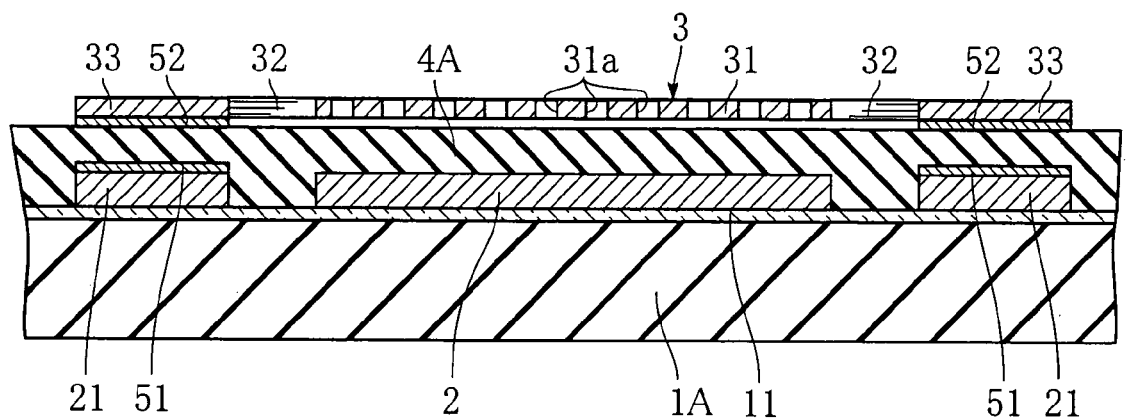
FIG. 10 is a sectional view showing the step of patterning a TiN layer in the manufacturing method.

As shown in FIG. 10, after the upper electrode 31 is formed, a pair of barrier metal layers 52 are formed by removing the TiN layer 52A except the portions directly under the paired anchor portions 33 of the upper electrode 3. This patterning may be performed by dry etching using a gas containing $CF_4$ as the etching gas. In the dry etching process, the etching gas is brought into contact with the TiN layer 52A by utilizing the through-holes 31a. Thus, even when the movable portion 31 is relatively large, the portion of the TiN layer 52A which is positioned directly under the movable portion 31 is properly removed.

Figure 11:
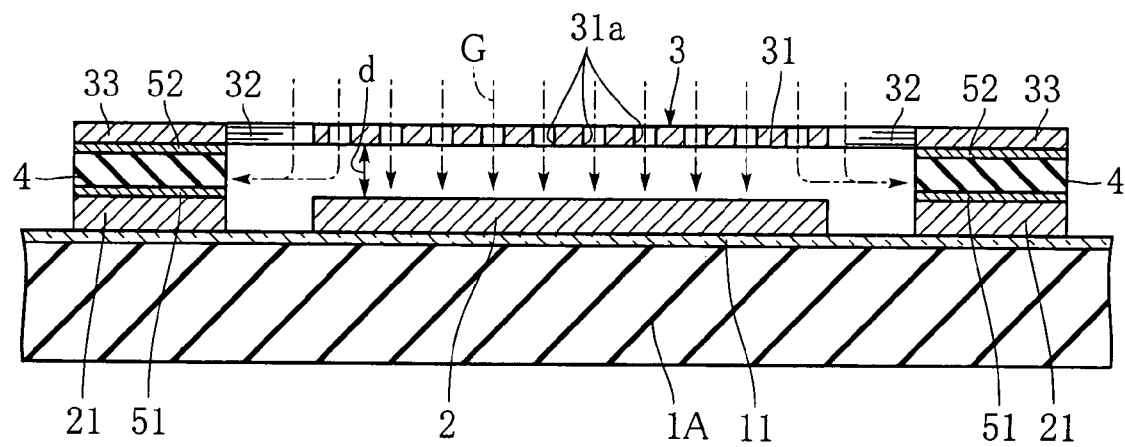
FIG. 11 is a sectional view of a principal portion showing the step of removing the sacrifice layer in the manufacturing method.

Then, the sacrifice layer 4A is removed except the portions sandwiched between the paired support layers 21 and the paired anchor portions 33. As shown in FIG. 11, this removal process is performed by dry etching using an etching gas G which dissolves only Si, which is the material of the sacrifice layer 4A. In the dry etching process, the etching gas G is supplied to the region under the movable portion 31 through the through-holes 31a. Thus, the etching gas G properly comes into contact with the portion of the sacrifice layer 4A which is positioned under the movable portion 31. Therefore, even when the movable portion 31 is relatively large, the sacrifice layer 4A is properly removed. Further, the time required for the dry etching is shortened. As a result of the dry etching, the movable portion 31 faces the lower electrode 2 while being spaced from the lower electrode by the distance d. The portions of the sacrifice layer 4A which are left serve as a pair of insulating layers 4. Then, after a wiring (not shown) for energizing the lower electrode 2 and the upper electrode 3 and so on is formed, the material substrate 1A is divided, whereby a plurality of MEMS elements A1 shown in FIG. 1 are obtained.

The advantages of the MEMS element A1 will be described below.

With the structure according to the present invention, the sacrifice layer 4A (see FIG. 10) is properly removed by performing dry etching via the through-holes 31a formed in the movable portion 31. With the dry etching, unlike the wet etching to remove the sacrifice layer 4A, the movable portion 31 is prevented from adhering to the lower electrode 2. Thus, the size of the movable portion 31 can be large, and the distance d can be small. The capacitance of the MEMS element A1 is proportional to the size of the movable portion 31 and inversely proportional to the distance d. Thus, the structure by the present invention is suitable for increasing the capacitance of the MEMS element A1. The MEMS element A1 described above is advantageously used in an acceleration sensor, for example, whereby the variation of the capacitance due to the acceleration can be detected properly. As the distance d is smaller, the capacitance of the MEMS element A1 varies more largely when the movable portion 31 moves up and down during the acceleration. Thus, the incorporation of the MEMS element A1 enhances the measurement accuracy of the acceleration sensor.

The through-holes 31a are square in cross section and the length w of each side of the square is about 15 μm. This configuration permits the etching gas for removing the sacrifice layer 4A to pass through the through-holes 31a properly. In general, when the length w of each side is about five to ten times the distance d, the proper passing of the etching gas is ensured, with the total amount of openings in the movable portion 31 prevented from becoming too large. Preferably the through-holes 31a may have the same size and be arranged at a uniform density, like the illustrated embodiment. This configuration helps the sacrifice layer 4A to be removed uniformly. Preferably, the through-holes 31a may be arranged in a matrix.

By setting the pitch between adjacent through-holes 31a to 40 μm, the portion of the sacrifice layer 4A which is positioned between the adjacent through-holes 31a as shown in FIG. 11 is removed in a short time by the etching gas passing through the through-holes 31a. To shorten the time taken for the removal of the sacrifice layer 4A and to prevent the total amount of openings in the movable portion 31 from becoming too large, it is preferable that the pitch p is about 15 to 25 times the distance d.

When the MEMS element A1 is used for an actuator, the operation accuracy of the actuator is enhanced. Specifically, by increasing the size of the movable portion 31 functioning as the drive portion, the up-down movement of the movable portion 31 upon the application of a voltage between the movable portion 31 and the lower electrode 2 is increased. Further, by reducing the distance d between the movable portion 31 and the lower electrode 2, the force applied to the movable portion 31 due to the variation of the voltage applied between the movable portion 31 and the lower electrode 2 is increased. Accordingly, the operation accuracy of the actuator is enhanced.

In the above-described first embodiment, the through-holes are not limited to those having a square cross section. For instance, the through-holes may have a circular cross section. When the through-holes have a circular cross section, the diameter corresponds to the opening width of the present invention. The through-holes do not necessarily need to be arranged in a matrix. For instance, the through-holes may be so arranged that adjacent three through-holes form an equilateral triangle. The shape of the movable portion is not limited to rectangular but may be polygonal or circular, for example. The upper electrode as the second electrode is not necessarily supported at two portions but may be supported only at one portion like a cantilever.

FIGS. 12-15 show an MEMS device A2 according to a second embodiment of the present invention. The illustrated MEMS device A2 includes a substrate 1', an MEMS element E, a protective plate 6', a resin package 7', and external terminals 8a', 8b' and 8c'. The MEMS device is structured as a capacitance type acceleration sensor.

The substrate 1' supports the MEMS element E and is made of an insulating material such as $Al_2O_3$. In this embodiment, the substrate 1 is generally rectangular and has a thickness of about 0.5 mm. The upper surface of the substrate 1' is covered by a glaze layer 11'. The glaze layer 11' provides a smooth surface suitable for forming the MEMS element E and may be formed by printing a liquid containing a glass component and then performing baking.

Figure 16:
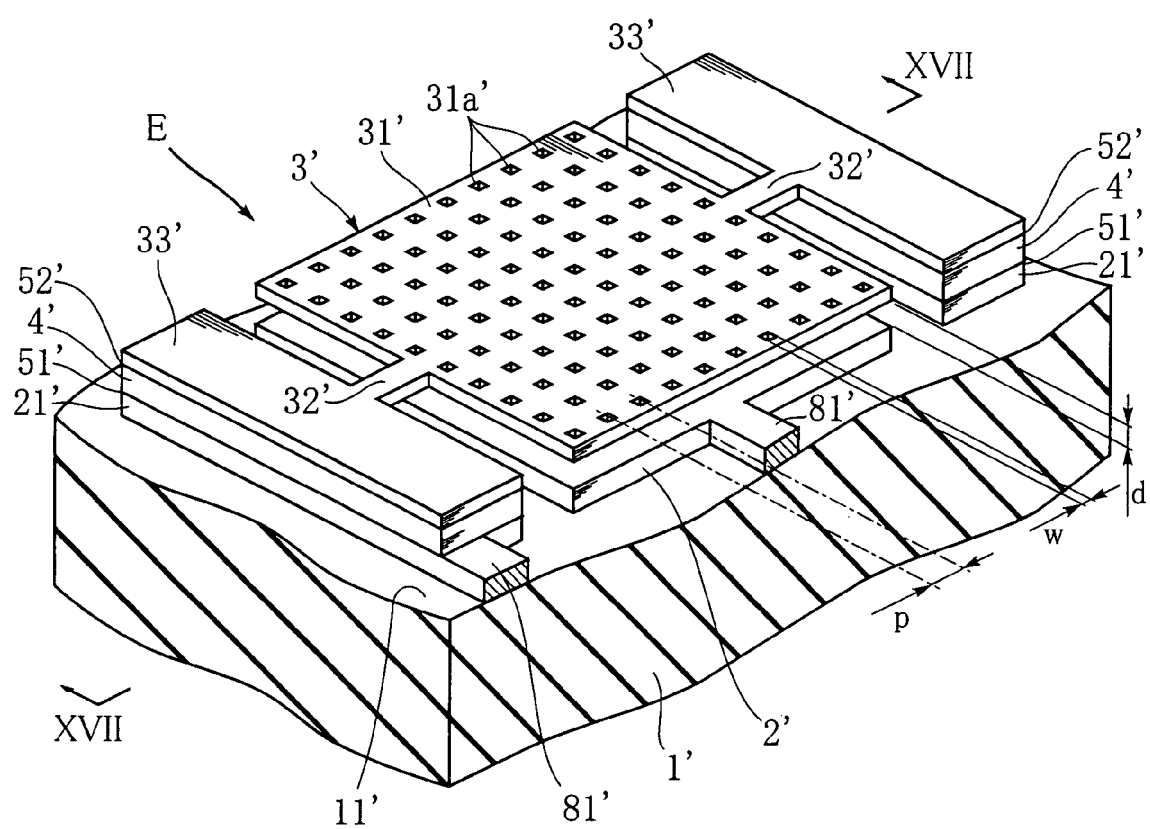
FIG. 16 is a perspective view showing an example of MEMS element used for the MEMS device.
Figure 17:
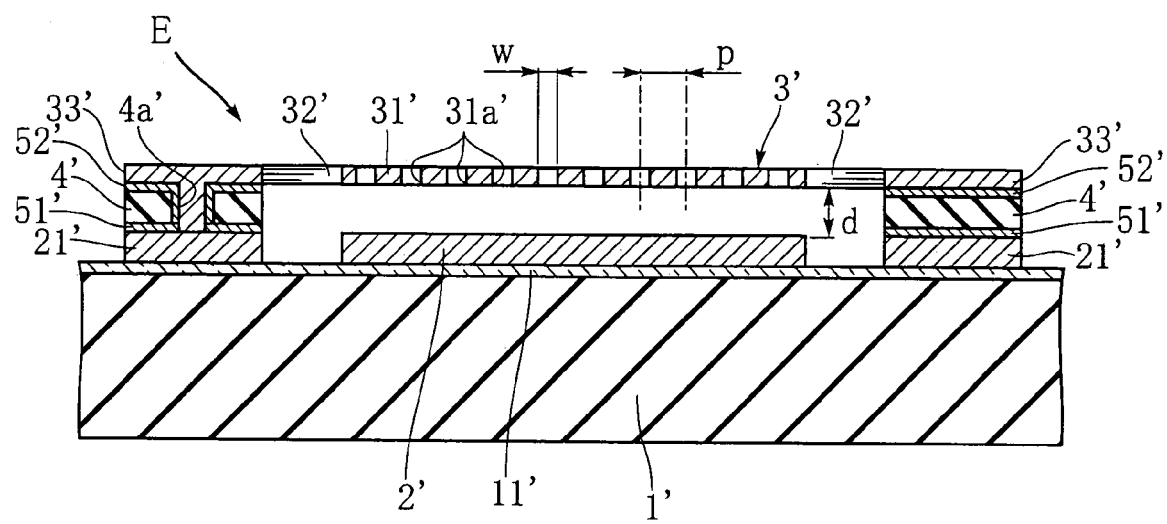
FIG. 17 is a sectional view of a principal portion taken along lines XVII-XVII in FIG. 16.
Figure 18:
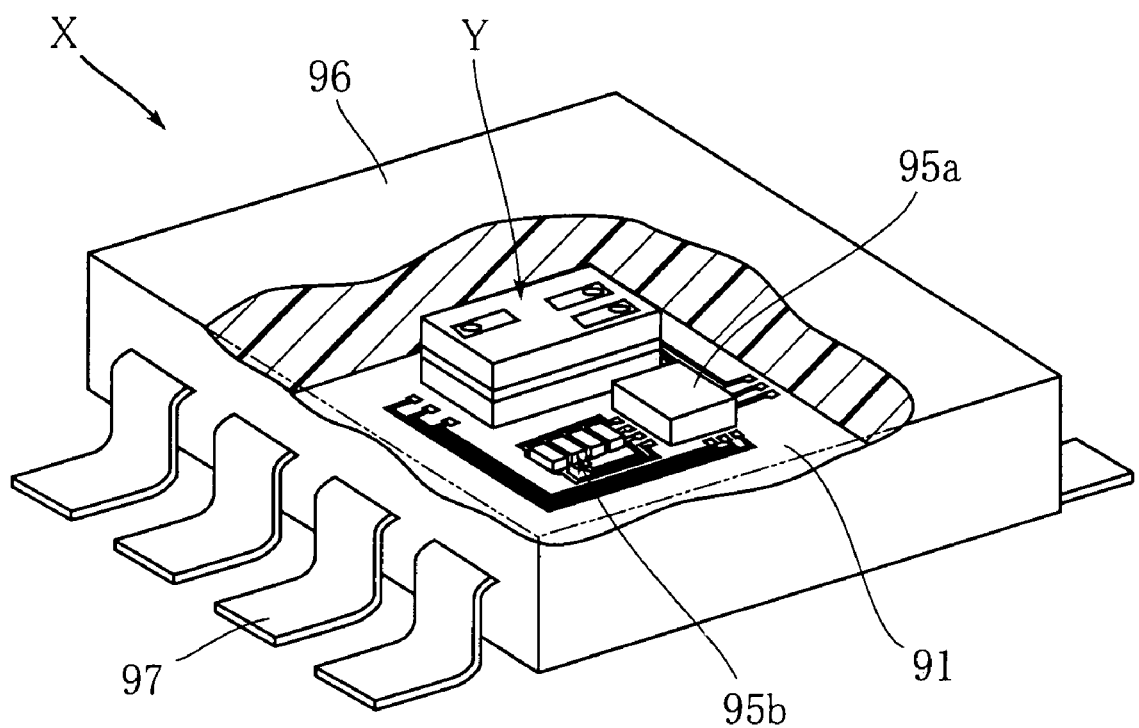
FIG. 18 is a perspective view showing an example of conventional MEMS device.
Figure 19:
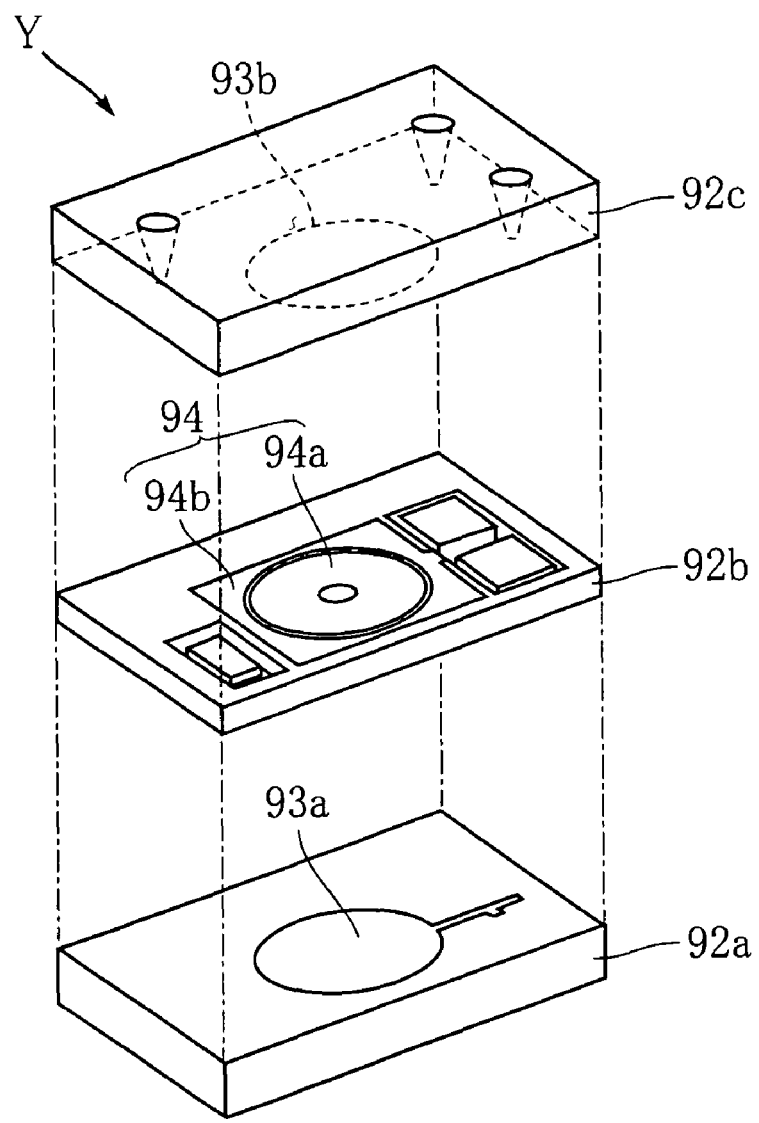
FIG. 19 is an exploded perspective view showing an MEMS element used for the conventional MEMS device.
Figure 20:
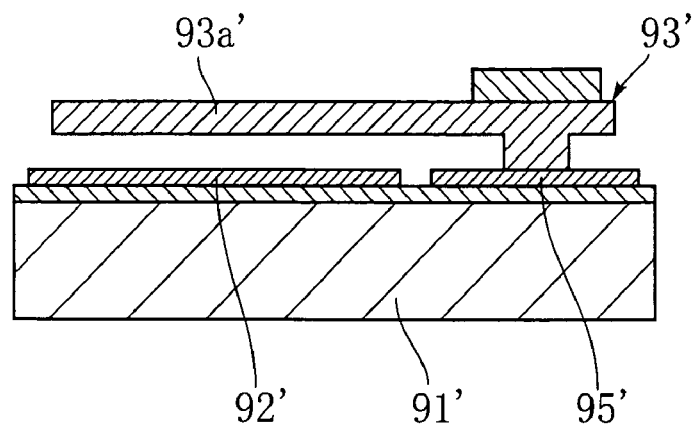
FIG. 20 is a sectional view showing another example of conventional MEMS element.
Figure 21:
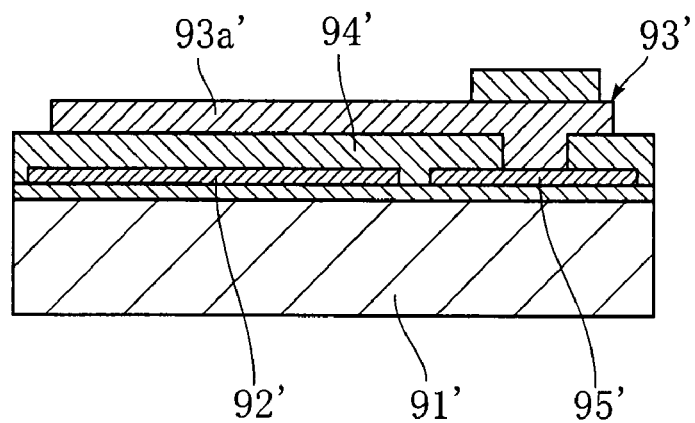
FIG. 21 is a sectional view showing the step of forming a sacrifice layer in a method for manufacturing the MEMS element shown in FIG. 20.

FIG. 16 shows the MEMS element E and the nearby portions of the MEMS device A2 as enlarged, whereas FIG. 17 is a sectional view thereof. The MEMS element E includes a lower electrode 2' as the first electrode, an upper electrode 3' as the second electrode, insulating layers 4' and support layers 21' which are formed on the substrate 1'. As will be described later, the lower electrode 2' and the upper electrode 3' comprise a thin conductor film, so that the MEMS element E is structured as a surface-type MEMS element. In the present invention, the "thin conductor film" means a conductor film formed by vacuum deposition or ion sputtering and having a film thickness of several micrometers.

The lower electrode 2' is formed on the glaze layer 11' and generally in the form of a rectangle having a side of about 2 mm. The lower electrode 2' may comprise a thin Al film and have a thickness of about 1.2 μm. The lower electrode 2' may be provided by forming a thin Al film on the glaze layer 11' by sputtering using Al and then performing patterning by wet etching. A wiring 81' is connected to the lower electrode 2'.

The support layers 21' are provided on opposite sides of the lower electrode 2'. The support layers 21' are utilized for fixing the upper electrode 3' to the substrate 1'. Similarly to the lower electrode 2', the support layers 21' may comprise a thin Al film and have a thickness of about 1.2 μm. The support layers 21' may be formed simultaneously with the lower electrode 2'. A wiring 81' is connected to one of the support layers 21'.

The insulating layers 4' are laminated on the support layers 21' via a pair of barrier metal layers 51'. The insulating layers 4' may be made of Si and have a thickness of about 2.0 μm. The barrier metal layers 51' prevent the support layers 21' and the insulating layers 4' from unduly reacting with each other. The barrier metal layers 51' may be made of TiN and have a thickness of about 250 Å. The barrier metal layers 51' may be made by forming a thin TiN film by sputtering using TiN and then performing patterning by dry etching. The method for forming the insulating layers 4' will be described later.

The upper electrode 3' is provided on the insulating layers 4' via a pair of barrier metal layers 52'. The barrier metal layers 52' prevent the insulating layers 4' and the upper electrode 3' from unduly reacting with each other. The barrier metal layers 52' may be made of TiN and have a thickness of about 250 Å. The barrier metal layers 52' are formed similarly to the barrier metal layers 51'.

The upper electrode 3' includes a movable portion 31', a pair of support portions 32' and a pair of anchor portions 33'. The upper electrode 3' may comprise a thin Al film and have a thickness of about 0.6 μm.

The movable portion 31' faces the lower electrode 2' while being spaced from the lower electrode by a distance d. With this arrangement, a capacitor having a variable capacitance is formed between the movable portion 31' and the lower electrode 2'. In this embodiment, the distance d is about 2.0 μm, which is substantially equal to the thickness of the insulating layers 4'. Similarly to the lower electrode 2', the movable portion 31' is generally in the form of a rectangle having a side of about 2 mm.

The movable portion 31' is formed with a plurality of through-holes 31a' arranged in a matrix. Each of the through-holes 31a' is square in cross section, and the length w of each side of the square as the opening width is about 15 μm. Preferably, the length w is about five to ten times the distance d. The pitch p of the through-holes 31a' is about 40 μm. Preferably, the pitch p is about 15 to 25 times the distance d. The movable portion 31' is supported at two positions, to be connected to the paired anchor portions 33' via the paired support portions 32'.

Each of the support portions 32' is narrower than the movable portion 31' and can be elastically deformed relatively easily. When acceleration in the vertical direction in the figure is produced, an inertial force proportionate to the mass of the movable portion 31' is applied to the support portions 32'. Due to the inertial force, the support portions 32' are flexed, which allows the movable portion 31' to move vertically.

The paired anchor portions 33' are utilized for fixing the upper electrode 3' to the substrate 1' and bonded to the insulating layers 4' via the barrier metal layers 52'. As shown in FIG. 17, the anchor portion 33' on the left in the figure is connected to the left support layer 21' via a through-hole 4a'. With this arrangement, the wiring 81' extending from the support layer 21' in FIG. 16 and the upper electrode 3' are electrically connected to each other.

The upper electrode 3' may be formed as follows. First, after the lower electrode 2', the paired support layers 21' and the paired barrier metal layers 51' are formed, a sacrifice layer of Si is formed to cover these portions. Specifically, the sacrifice layer is so formed that the portion of the sacrifice layer which is positioned on the lower electrode 2' has a thickness of about 2.0 μm. Then, a TiN layer and an Al layer are laminated to cover the sacrifice layer. The thicknesses of the TiN layer and the Al layer are about 250 Å and 0.6 μm, respectively. Then, patterning of the Al layer and the TiN layer is performed, whereby the above-described upper electrode 2' and barrier metal layers 52' are formed. Then, the sacrifice layer is removed by dry etching except the portions sandwiched between the paired anchor portions 33' and the paired support portions 21'. In the dry etching, the etching gas passes through the through-holes 31a' of the movable portion 31' to properly come into contact with the sacrifice layer. As a result, the lower electrode 2' and the movable portion 31' face each other while being spaced from each other by the distance d.

Figure 13:
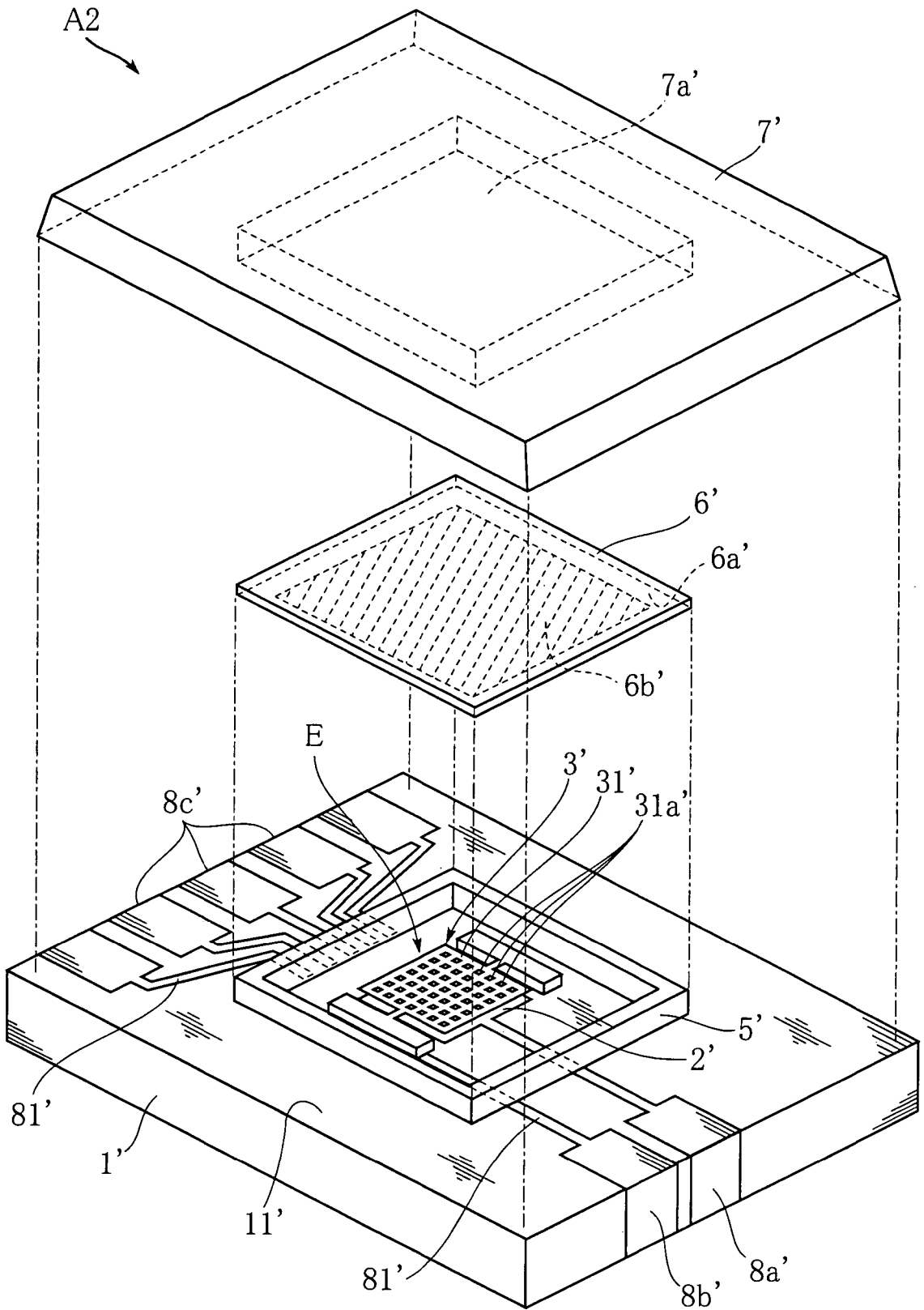
FIG. 13 is an exploded perspective view of the MEMS device.
Figure 14:
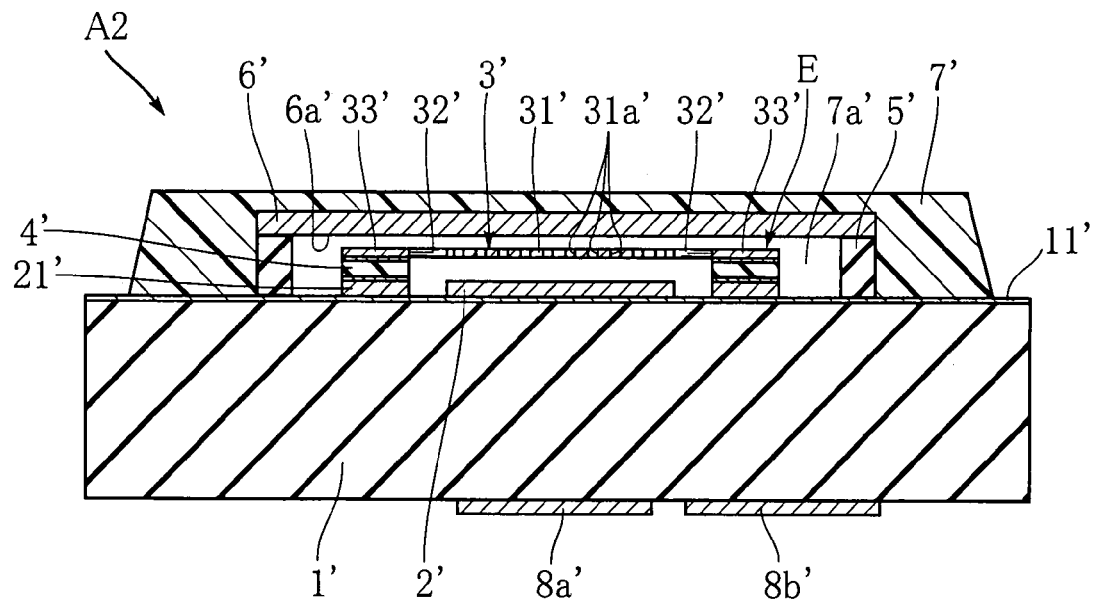
FIG. 14 is a sectional view taken along lines XIV-XIV in FIG. 12.
Figure 15:
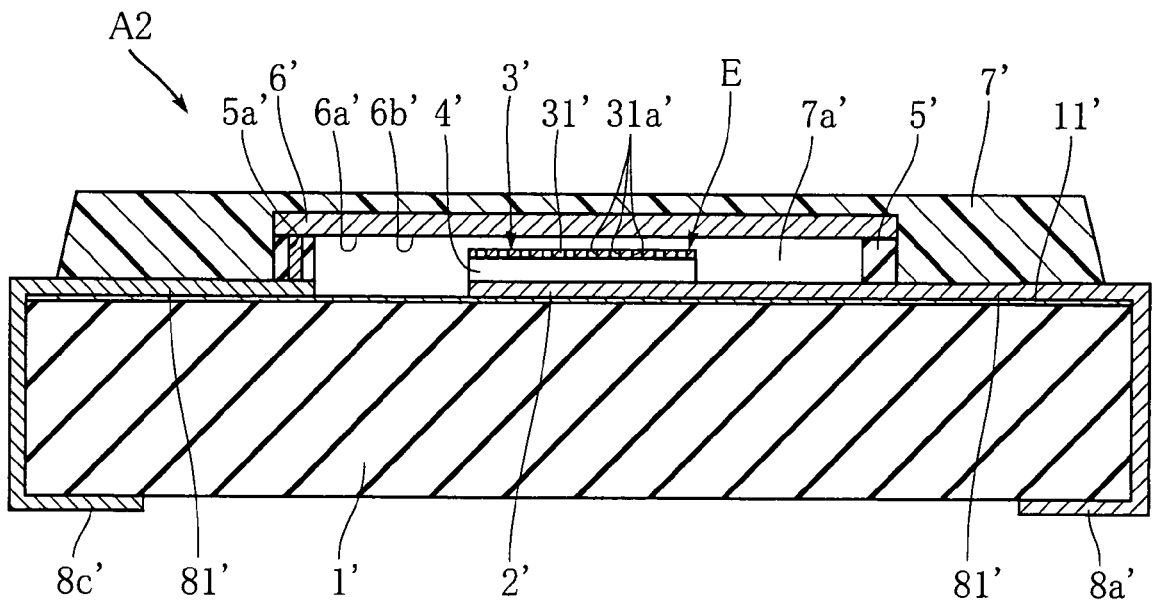
FIG. 15 is a sectional view taken along lines XV-XV in FIG. 12.

As shown in FIGS. 13-15, the MEMS element E is surrounded by a frame projection 5'. The frame projection 5' supports the protective plate 6' and is made of an insulating material such as $SiO_2$.

The protective plate 6' is bonded to the upper end of the frame projection 5'. The protective plate 6' may be made of Si and have a thickness of about 0.1 μm. As shown in FIG. 13, the lower surface of the protective plate 6' is an active surface 6a' in which an IC 6b' is provided. The IC 6b' functions as a controller for measuring the acceleration based on the variation of the capacitance of the MEMS element E. With this arrangement, the function of the MEMS device is enhanced by the provision of the IC, and the thickness of the device is reduced. As shown in FIG. 15, the terminal (not shown) of the IC 6b' and the left wiring 81' are connected to each other via a through-hole 5a' formed at the frame projection 5'. As a result, the external terminals 8c' shown in FIG. 13 and the above-described terminal (not shown) of the IC 6b' are electrically connected to each other.

The resin package 7' protects the MEMS element E from shock, moisture and so on and may be made of epoxy resin. The resin package 7' have a thickness of about 100 μm and includes a space 7a' for accommodating the MEMS element E. The resin package 7' may be formed by molding using an epoxy-based resin material after the provision of the frame projection 5' and the protective plate 6'. In this molding process, the resin material for forming the resin package 7' is blocked by the frame projection 5' and the protective plate 6' and does not flow toward the MEMS element E. The portion into which the resin material is not loaded becomes the space 7a'.

Figure 12:
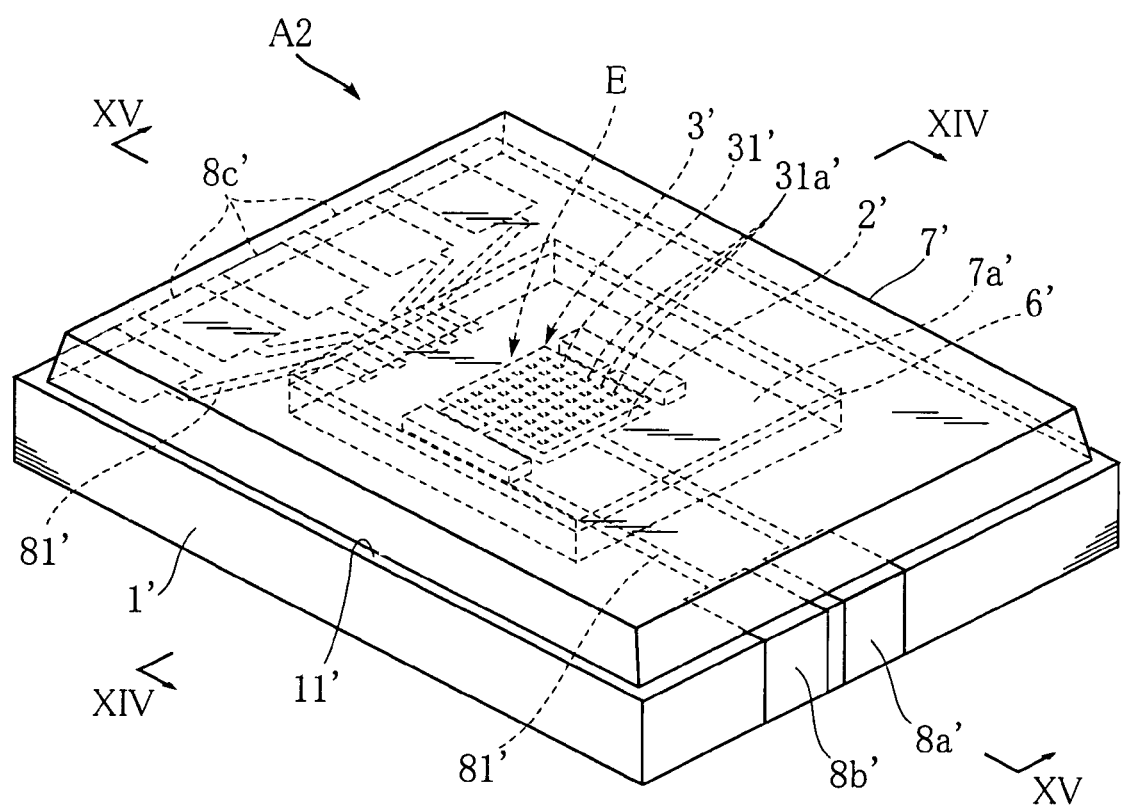
FIG. 12 is a perspective view showing an MEMS device according to a second embodiment of the present invention.

As shown in FIGS. 12 and 13, external terminals 8a', 8b' and 8c' are provided at the opposite ends of the substrate 1'. The external terminals 8a' and 8b' are utilized for measuring the capacitance of the MEMS element E. The external terminals 8c' are utilized for signal transmission/reception with respect to the IC 6b'. It is to be noted that only the external terminals 8c' may be provided and the external terminals 8a' and 8b' may be dispensed with. In this case, in the MEMS device A2, the lower electrode 2' and the upper electrode 3' are electrically connected to the IC 6b'.

The advantages of the MEMS device A2 will be described below.

In this embodiment, a surface-type MEMS element is used as the MEMS element E. Since each of the lower electrode 2' and the upper electrode 3' comprises a thin Al film, the MEMS element E has a relatively small thickness of about 4 μm. Therefore, the thickness of the resin package 7' for protecting the MEMS element E can be set to about 100 μm. Thus, the MEMS device A2 has a relatively small thickness of about 0.6 mm. Therefore, the MEMS device A2 is suitable to be mounted to a cellular phone, for example.

By making the substrate 1' using a ceramic material, the insulating properties and strength of the substrate 1' are enhanced. Thus, even when the thickness of the substrate 1' is reduced, undesirable electrical conduction and breakage due to external force can be avoided. Therefore, the thickness of the MEMS device A2 can be reduced.

In the process of manufacturing the MEMS element E, the sacrifice layer is properly removed by dry etching utilizing the through-holes 31a' formed at the movable portion 31'. By employing dry etching, the possibility that the movable portion 31' adheres to the lower electrode 2' in the process of removing the sacrifice layer is eliminated. Therefore, the size of the movable portion 31' can be increased, and the distance d can be reduced. The capacitance of the MEMS element E is proportional to the size of the movable portion 31' and inversely proportional to the distance d. Thus, the capacitance of the MEMS element E can be properly increased. The larger the capacitance of the MEMS element E is, the more readily the variation of capacitance due to acceleration is detected.

Further, the smaller the distance d is, the larger the variation of the capacitance of the MEMS element E is when the movable portion 31' moves up and down due to the acceleration. Because of the above-described reasons, the measurement accuracy of the MEMS device A2 as the acceleration sensor is enhanced.

By making the through-holes 31a' have a square cross section having a side length w of about 15 μm, the etching gas for removing the sacrifice layer properly passes through the through-holes 31a'. When the side length w is about five to ten times the distance d, the etching gas passes properly, while total amount of openings in the movable portion 31' is not too large.

When the pitch p between adjacent through-holes 31a' is 40 μm, the sacrifice layer is removed in a relatively short time by the etching gas passing through the through-holes 31a'. To shorten the time taken for the removal of the sacrifice layer and to prevent the total amount of openings in the movable portion 31' from becoming too large, it is preferable that the pitch p is about 15 to 25 times the distance d.

When the MEMS device A2 is structured as an actuator, the operation accuracy of the actuator is enhanced. Specifically, by increasing the size of the movable portion 31' functioning as the drive portion, the up-down movement of the movable portion 31' upon the application of a voltage between the movable portion 31' and the lower electrode 2' is increased. Further, by reducing the distance d between the movable portion 31' and the lower electrode 2', the force applied to the movable portion 31' due to the variation of the voltage applied between the movable portion 31' and the lower electrode 2' is increased. Therefore, the operation accuracy of the MEMS device A2 as an actuator is enhanced. Examples of actuator includes a mirror device for optical path switching including a movable portion 31' structured as a mirror, and a resin package 7' and a protective plate 6' which are pervious to light.

The MEMS device of the present invention is not limited to the foregoing embodiments. For instance, the lower electrode and the upper electrode are not limited to those made of a thin Al film and may be made of any other thin conductor films. The shape of the movable portion is not limited to rectangular but may be polygonal or circular, for example. The upper electrode as the second electrode is not necessarily supported at two positions but may be supported only at one position.

The through-holes are not limited to those having a square cross section. For instance, the through-holes may have a circular cross section. When the through-holes have a circular cross section, the diameter corresponds to the opening width of the present invention. The through-holes do not necessarily need to be arranged in a matrix. For instance, the through-holes may be so arranged that adjacent three through-holes form an equilateral triangle.

Instead of incorporating an IC in the protective plate, an IC formed separately from the protective plate may be provided on the substrate. In this case, the protective plate 6' may be made of glass. The material of the substrate is not limited to a ceramic material but may be any other materials having excellent insulating properties and mechanical strength.

The MEMS device of the present invention can be structured as various kinds of devices, including sensors such as an acceleration sensor and a flow sensor, and actuators, and so forth.

The invention claimed is:

1. A MEMS element comprising:
   a substrate;
   a first electrode formed over the substrate; and
   a second electrode including a movable portion and an anchor portion, the anchor portion being connected to the movable portion and affixed to the substrate, the movable portion being spaced from the first electrode and facing the first electrode;
   wherein the movable portion is formed with a plurality of through-holes;
   wherein the anchor portion is non-perforated;
   wherein the movable portion is connected to the anchor portion via a support portion which is narrower than the movable portion;
   wherein the second electrode is a metal film; and
   wherein the anchor portion is affixed to the substrate via a laminate of layers which includes a first conductor layer made of a same conductor material as the first electrode, a Si-containing layer, a second conductor layer made of a same conductor material as the second electrode, a first barrier metal layer interposed between the first conductor layer and the Si-containing layer, and a second barrier metal layer interposed between the Si-containing layer and the second conductor layer.

2. The MEMS element according to claim 1, wherein each of the through-holes has an opening width which is five to ten times a distance between the first electrode and the movable portion of the second electrode.

3. The MEMS element according to claim 1, wherein the through-holes have a same size and arranged at a constant density.

4. The MEMS element according to claim 3, wherein the through-holes are arranged in a matrix.

5. The MEMS element according to claim 3, wherein the through-holes are arranged at a pitch which is 15 to 25 times a distance between the first electrode and the movable portion of the second electrode.

6. A MEMS device comprising:
   a substrate;
   an MEMS element formed on the substrate, the MEMS element including a first electrode formed over the substrate and a second electrode formed over the first electrode, the second electrode including a movable portion and an anchor portion, the anchor portion being connected to the movable portion and affixed to the substrate, the movable portion being spaced from the first electrode and facing the first electrode;
   a package including a space for accommodating the MEMS element; and
   an external mounting terminal;
   wherein each of the first electrode and the second electrode comprises a metal film;
   wherein the movable portion is formed with a plurality of through-holes;
   wherein the anchor portion is non-perforated;
   wherein the movable portion is connected to the anchor portion via a support portion which is narrower than the movable portion; and
   wherein the anchor portion is affixed to the substrate via a laminate of layers which includes a first conductor layer made of a same conductor material as the first electrode, a Si-containing layer, a second conductor layer made of a same conductor material as the second electrode, a first barrier metal layer interposed between the first conductor layer and the Si-containing layer, and a second barrier metal layer interposed between the Si-containing layer and the second conductor layer.

7. The MEMS device according to claim 6, wherein the substrate is made of a ceramic material.

8. The MEMS device according to claim 6, wherein the substrate is formed with a glaze layer for forming the first electrode.

9. The MEMS device according to claim 6, wherein each of the through-holes has an opening width which is five to ten times a distance between the first electrode and the movable portion of the second electrode.

10. The MEMS device according to claim 6, wherein the through-holes have a same size and arranged at a constant density.

11. The MEMS device according to claim 6, wherein the through-holes are arranged in a matrix.

12. The MEMS device according to claim 10, wherein the through-holes are arranged at a pitch which is 15 to 25 times a distance between the first electrode and the movable portion of the second electrode.

13. The MEMS device according to claim 6, further comprising a protective plate facing the substrate via a space.

14. The MEMS device according to claim 13, wherein the protective plate is made of Si and includes a surface provided with an IC.

15. The MEMS element according to claim 1, wherein each of the first and second electrodes is made of an aluminum film.

16. The MEMS element according to claim 6, wherein each of the first and second electrodes is made of an aluminum film.

17. A MEMS element comprising;
a substrate made of alumina and formed with a glaze layer;
a first electrode formed over the glaze layer of the substrate; and
a second electrode formed over the first electrode, the second electrode including a movable portion spaced from the first electrode and facing the first electrode;
wherein the second electrode is supported on the substrate via a laminate of layers which includes a first conductor layer made of a same conductor material as the first electrode, a Si-containing layer, a second conductor layer made of a same conductor material as the second electrode, a first barrier metal layer interposed between the first conductor layer and the Si-containing layer, and a second barrier metal layer interposed between the Si-containing layer and the second conductor layer.

18. A MEMS device comprising;
a substrate made of alumina and formed with a glaze layer;
an MEMS element formed on the glaze layer of the substrate, the MEMS element including a first electrode formed over the glaze layer of the substrate and a second electrode formed over the first electrode, the second electrode including a movable portion spaced from the first electrode and facing the first electrode;
a package including a space for accommodating the MEMS element; and
an external mounting terminal;
wherein the second electrode is supported on the substrate via a laminate of layers which includes a first conductor layer made of a same conductor material as the first electrode, a Si-containing layer, a second conductor layer made of a same conductor material as the second electrode, a first barrier metal layer interposed between the first conductor layer and the Si-containing layer, and a second barrier metal layer interposed between the Si-containing layer and the second conductor layer.

19. The MEMS element according to claim 17, wherein each of the first and second barrier layers is made of TiN.

20. The MEMS element according to claim 18, wherein each of the first and second barrier layers is made of TiN.

* * * * *